United States Patent
Gelderd et al.

(10) Patent No.: US 10,199,751 B1
(45) Date of Patent: Feb. 5, 2019

(54) CONNECTOR ASSEMBLY

(71) Applicant: OneSubsea IP UK Limited, London (GB)

(72) Inventors: Stephen Gelderd, Ulverston (GB); Oliver David Booth, Barrow-in-Furness (GB); Rossa Miller, Ulverston (GB)

(73) Assignee: OneSubsea IP UK Limited, London (GB)

( * ) Notice: Subject to any disclaimer, the term of this patent is extended or adjusted under 35 U.S.C. 154(b) by 0 days.

(21) Appl. No.: 15/668,735

(22) Filed: Aug. 4, 2017

(51) Int. Cl.
| | |
|---|---|
| *H01R 4/48* | (2006.01) |
| *H01R 4/60* | (2006.01) |
| *E21B 33/043* | (2006.01) |
| *E21B 34/04* | (2006.01) |
| *H01R 13/523* | (2006.01) |
| *G01R 1/067* | (2006.01) |
| *E21B 34/00* | (2006.01) |

(52) U.S. Cl.
CPC .............. *H01R 4/48* (2013.01); *E21B 33/043* (2013.01); *E21B 34/04* (2013.01); *G01R 1/06722* (2013.01); *H01R 13/523* (2013.01); *E21B 2034/002* (2013.01)

(58) Field of Classification Search
CPC .. H01R 13/523; H01R 4/4809; H01R 4/4818; E21B 33/043
See application file for complete search history.

(56) References Cited

U.S. PATENT DOCUMENTS

| | | | |
|---|---|---|---|
| 6,720,511 B2* | 4/2004 | Windebank | H01H 1/245 200/275 |
| 7,315,176 B2* | 1/2008 | Nelson | G01R 1/06722 324/755.05 |
| 7,556,503 B2 | 7/2009 | Vinther | |
| 8,734,193 B2* | 5/2014 | Tokuhara | H01R 12/714 439/700 |
| 9,466,909 B1 | 10/2016 | Lin et al. | |
| 9,784,549 B2* | 10/2017 | Eitschberger | F42D 1/05 |
| 2005/0042903 A1 | 2/2005 | Nicholson | |
| 2008/0143367 A1 | 6/2008 | Chabineau-Lovgren | |
| 2009/0301723 A1* | 12/2009 | Gray | E21B 23/00 166/301 |
| 2010/0227514 A1 | 9/2010 | Rikimaru et al. | |
| 2014/0065893 A1 | 3/2014 | Vinther | |

FOREIGN PATENT DOCUMENTS

| | | |
|---|---|---|
| EP | 2423534 A2 | 2/2012 |
| EP | 2490304 A2 | 8/2012 |
| GB | 2404291 A | 1/2005 |
| WO | 2015199550 A2 | 12/2015 |
| WO | 2017207973 A1 | 12/2017 |

OTHER PUBLICATIONS

Extended European Search Report issued in European Patent Appl. No. 18187349.8 dated Sep. 18, 2018; 7 pages.

* cited by examiner

*Primary Examiner* — Xuong Chung Trans
(74) *Attorney, Agent, or Firm* — Brandon S. Clark (57) ABSTRACT

An apparatus includes a first contact to be electrically connected to a first cable segment and a second contact to be electrically connected to a second cable segment. The apparatus includes a spring to absorb a loading placed on the first contact. The spring is adapted to form at least part of an electrical communication path between the first cable segment and the second cable segment.

22 Claims, 7 Drawing Sheets

FIG. 6

CONNECTOR ASSEMBLY

BACKGROUND

A subsea well may contain a number of cables that extend through the wellhead. As examples, the cables may contain optical and electrical wires that may be used for such purposes as communicating power to equipment deployed downhole in the subsea well; communicating telemetry signals from downhole sensors (representing sensed pressures, sensed temperatures, and so forth); and communicating stimuli to control downhole equipment. A given cable may be formed from multiple segments that are connected together by dry mate or wet mate connector assemblies.

SUMMARY

In accordance with an example implementation, an apparatus includes a first contact to be electrically connected to a first cable segment and physically engage a second contact that is electrically connected to a second cable segment to form an electrical communication path between the first and second cable segments. The apparatus includes a spring to absorb a loading placed on the first contact. The spring is adapted to form at least part of the electrical communication path between the first cable segment and the second cable segment.

In accordance with a further example implementation, a system includes a wellhead valve block and a tubing hanger. The system includes a first connector assembly that is associated with the wellhead valve block and a first cable segment; and the system includes a second connector assembly that is associated with the tubing hanger and a second cable segment. The first connector assembly includes a first contact, the second connector assembly includes a second contact, and the first and second connector assemblies are adapted to mate to cause the first and second contacts to physically engage each other to form an electrical communication path between the first cable segment and the second cable segment. The first connector assembly includes a spring to absorb a loading placed on the first contact. The spring is adapted to form at least part of the electrical communication path between the first cable segment and the second cable segment.

In accordance with yet another example implementation, a technique includes coupling first and second cable segments together, including engaging a first contact electrically connected to a first cable segment with a second contact electrically connected to a second cable segment. The technique includes accommodating variation in axial stackup positions of the first and second contacts, including using a spring to absorb a loading placed on the first contact and communicating an electrical signal between the first and second cable segments through the spring.

Advantages and other features will become apparent from the following drawings, description and claims.

DETAILED DESCRIPTION

In the drawings and description that follow, like parts are typically marked throughout the specification and drawings with the same reference numerals. The drawing figures are not necessarily to scale. Certain features of the disclosed implementations may be shown exaggerated in scale or in somewhat schematic form and some details of conventional elements may not be shown in the interest of clarity and conciseness. The present disclosure is susceptible to implementations of different forms. Specific implementations are described in detail and are shown in the drawings, with the understanding that the present disclosure is to be considered an exemplification of the principles of the disclosure, and is not intended to limit the disclosure to that illustrated and described herein. It is to be fully recognized that the different teachings of the implementations discussed below may be employed separately or in any suitable combination to produce desired results.

Unless otherwise specified, in the following discussion and in the claims, the terms "including" and "comprising" are used in an open-ended fashion, and thus should be interpreted to mean "including, but not limited to." Any use of any form of the terms "mate," "connect," "engage," "couple," "attach," or any other term describing an interaction between elements is not meant to limit the interaction to direct interaction between the elements and may also include indirect interaction between the elements described. The various characteristics mentioned above, as well as other features and characteristics described in more detail below, will be readily apparent to those skilled in the art upon reading the following detailed description of the implementations, and by referring to the accompanying drawings.

Electrical connections for a subsea well may be routed through the annular space (called the "annulus") between the production tubing and well casing. For example, a particular cable may include a first cable segment that is routed through a wellhead valve block (or "Christmas tree" sections) and a second cable segment that is routed through a tubing hanger. The first and second cable segments terminate in corresponding cable connector assemblies that mate with each other and are connected to the wellhead valve block and tubing hanger. In this manner, when the cable connector assemblies mate, electrical contacts of the assemblies physically engage each other along a particular connection axis. The electrical contacts of the mating connector assemblies may, however, have associated axial positions that may vary within a certain tolerance. To compensate for variations in the axial positions, the connector assemblies may have one or multiple mechanisms, which cause the contacts to physically engage each other and sustain or absorb the loading due to the axial variation tolerance.

For example, a given cable connector assembly may contain a pair of mechanical coiled, or helical, springs. One helical spring may be constructed to deflect first to allow an electrical contact of the assembly to engage an electrical contact of a mating connector assembly. The other helical spring may have a relatively larger cross-sectional size and be constructed to sustain or absorb the axial loading placed on the components of the connector assembly. Moreover, an electrical communication path for the connector assembly may extend along the axis of the larger spring and thus, may be surrounded by the windings of the larger spring.

The overall cross-sectional size of the connector assembly may depend on the cross-sectional size of its largest helical spring. In general, it may be advantageous for a connector assembly to occupy a relatively small space inside the well annulus, as with the ever increasing number of services and equipment being deployed in subsea wells, the size of the connector assembly may place a limit on the number of cables that may be routed through the wellhead (thereby, potentially placing a limit on the number of services and equipment).

In accordance with example implementations that are described herein, a cable connector assembly includes a load absorbing mechanism, which has features that allow the cross-sectional size of the assembly to be relatively small, as compared to conventional cable connector assemblies. More specifically, the load absorption mechanism accommodates a stackup tolerance along a connection axis, and the load absorption mechanism also serves as an electrical conductor to form part of the electrical communication path for the connector assembly. Due to the load absorption mechanism of the connector assembly serving these dual functions, the cross-sectional size of the connector assembly may be reduced, as compared to, for example, a connector assembly that has a helical spring that surrounds a separate, electrical communication path. In accordance with example implementations, the load absorbing member may be a mechanical spring, such as a helical spring or a slotted metal spring.

Figure 1A:
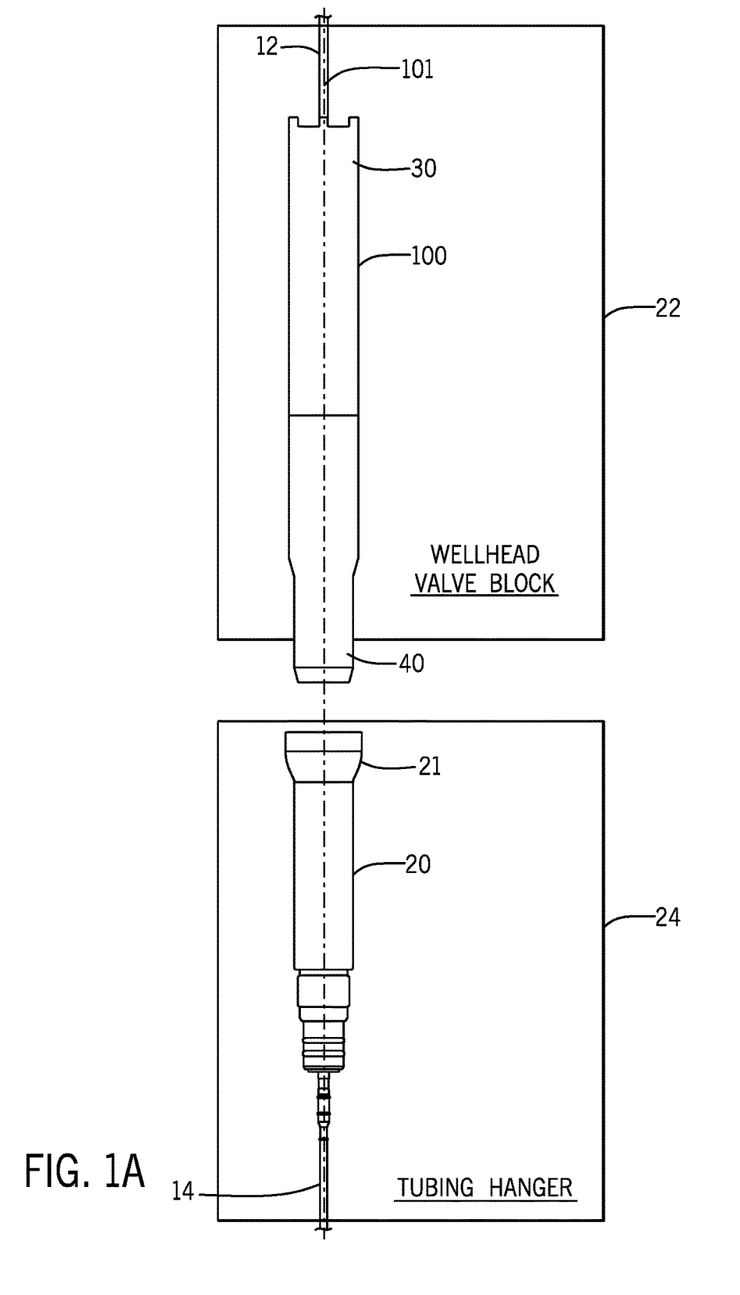
FIG. 1A is a schematic diagram illustrating cable connector assemblies for a subsea well system according to an example implementation.

As a more specific example, FIG. 1A depicts a cable formed from a cable segment 12 and a cable segment 14 extending through a wellhead valve block 22 (a Christmas tree section, for example) and a tubing hanger 24 of a subsea well. More specifically, the cable segment 12 terminates in a wet mate, male cable connector assembly 100 (i.e., the end of the cable segment 12 is mechanically and electrically connected to the connector assembly 100), and the connector assembly 100 is secured to the wellhead valve block 22. The cable segment 14 terminates in a wet mate, female connector assembly 20 that is secured to the tubing hanger 24. When the wellhead valve block 22 is secured, or attached, to the tubing hanger 24, the connector assemblies 20 and 100 mate with each other along a longitudinal connection axis 101 to form a sealed mechanical connection and to form an electrical communication path between the cable segments 12 and 14.

Figure 1B:
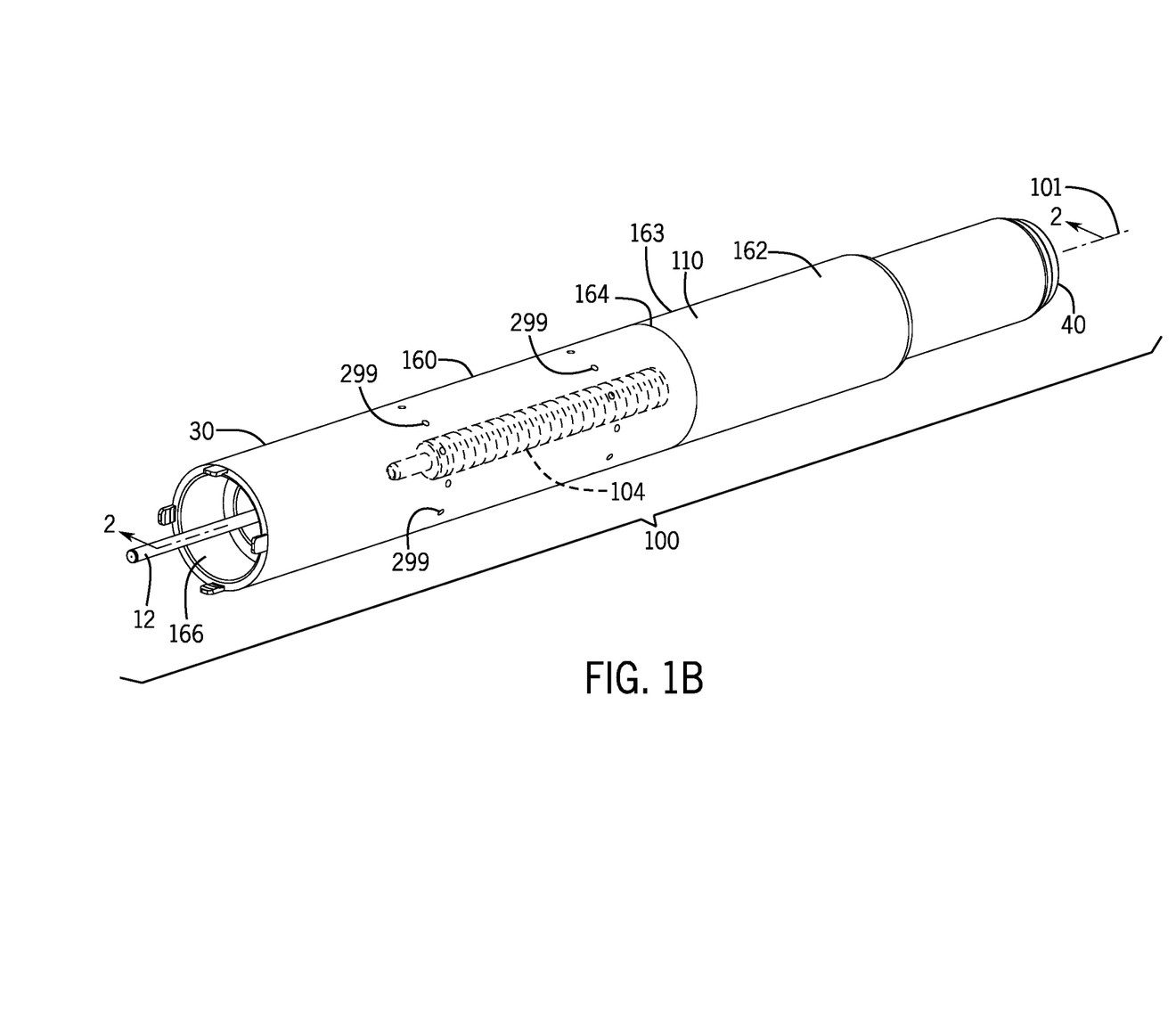
FIG. 1B is an isometric view of the upper cable connector assembly of FIG. 1A according to an example implementation.

Referring to FIG. 1B in conjunction with FIG. 1A, in accordance with example implementations, the connector assembly 100 includes a tubular housing 110 having an end 30 that receives the cable segment 12 and an end 40 that is received by a mating receptacle 21 of the connector assembly 20. The connector assembly 100 includes a slotted metal spring 104, which provides axial load absorption for the internal components of the assembly 100 (inside the housing 110) and forms part of the electrical communication path for the assembly 100, which electrically couples the cable segments 12 and 14 together.

Although a single slotted metal spring 104 is described herein, in accordance with further example implementations, the cable connector assembly 100 may include multiple slotted metal springs that provide biasing forces and form segments of the electrical communication path for the electrical connector assembly 100. Moreover, in accordance with further example implementations, the cable connector assembly may include a biasing mechanism (a mechanical coiled, or helical, spring, as an example) other than a slotted metal spring for purposes of providing the dual function of providing load absorption and forming part of the electrical communication path for the connector assembly. Moreover, in accordance with further example implementations, although the connector assembly 100 is discussed in the context of a subsea wellhead, it is understood that the apparatuses and techniques that are described herein may be applied to electrical connector assemblies that are used in applications other than applications associated with subsea wells, submersible connections, or wells in general. In this manner, in accordance with further example implementations, the connector assembly 100 may be used to establish any electrical connection which requires compliance or has a ranging tolerance.

Figure 2:
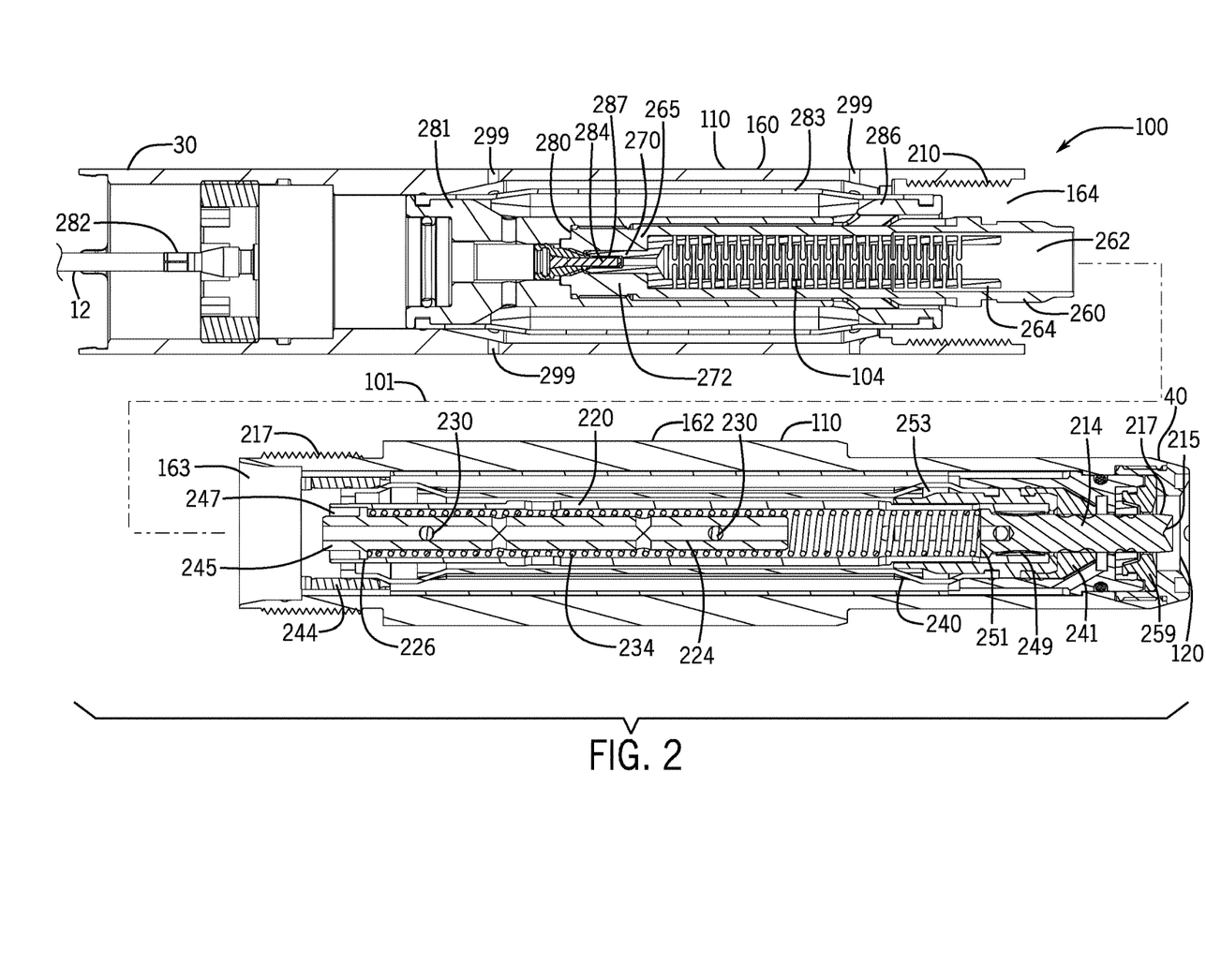
FIG. 2 is a cross-sectional view taken along line 2-2 of FIG. 1B according to an example implementation.

Referring to FIG. 2 in conjunction with FIG. 1B, in accordance with example implementations, the housing 110 of the connector assembly 100 may be formed from two, threadably connected tubular housing sections 160 and 162. In this manner, the housing sections 160 and 162 may circumscribe the longitudinal axis 101. One end 166 of the housing section 160 forms the end 30 of the connector assembly 100, which receives the cable segment 12; and the opposite end 164 of the housing section 160 has inner threads 210 that threadably mate with outer threads 217 that are formed on an end 163 of the housing section 162. The opposite end of the housing section 162 forms the end 40 of the connector assembly 100, which is received by the receptacle 21 (FIG. 1A) of the connector assembly 20.

In accordance with example implementations, an electrically insulative, or dielectric, sleeve 260, which is surrounded by the outer housing section 160, circumscribes the longitudinal connection axis 101 and circumscribes the slotted metal spring 104. The sleeve 260, in general, has a relatively larger interior diameter portion 272, which contains a main body and pin 264 end of the spring 104, and a relatively more narrow interior portion 263 that houses a female end 270 of the spring 104. The transition between the interior portions 272 and 263 forms a shoulder, or stop 265, for the slotted metal spring 104.

In accordance with example implementations, the connector assembly 100 includes another spring to provide an axial biasing force to facilitate contact between mating electrical contacts of the connector assemblies 100 and 20. In this manner, in accordance with example implementations, the connector assembly 100 includes a mechanical coiled, or helical, spring 234, which circumscribes the longitudinal axis 101 and is disposed inside the housing section 162. The helical spring 234 circumscribes a dielectric tube 224, which, in turn, circumscribes the longitudinal axis 101. When the connector assembly 100 is assembled (see FIG. 3), the pin end 264 of the slotted metal spring 104 (on the opposite end of the spring 104 from the female end 270) slides over an end 245 of the tube 224 and into an annular space 247 that is formed between the outer surface of the tube 224 and the inner surface of an electrically conductive tube 220, which circumscribes, or surrounds, the tube 224 and circumscribes the longitudinal axis 101.

Thus, the pin end 264 of the slotted metal spring 104 slides over the end 245 of the tube 224 and physically contacts the inner surface of the outer electrically conductive tube 220. A radially extending shoulder 226 of the tube 220 forms an annular stop for the pin end 264 of the slotted metal spring 104. The helical spring 234 abuts the annular face of the shoulder 226 opposite from the annular face of the shoulder 226 that contacts the pin end 264 of the slotted metal spring 104.

Figure 3:
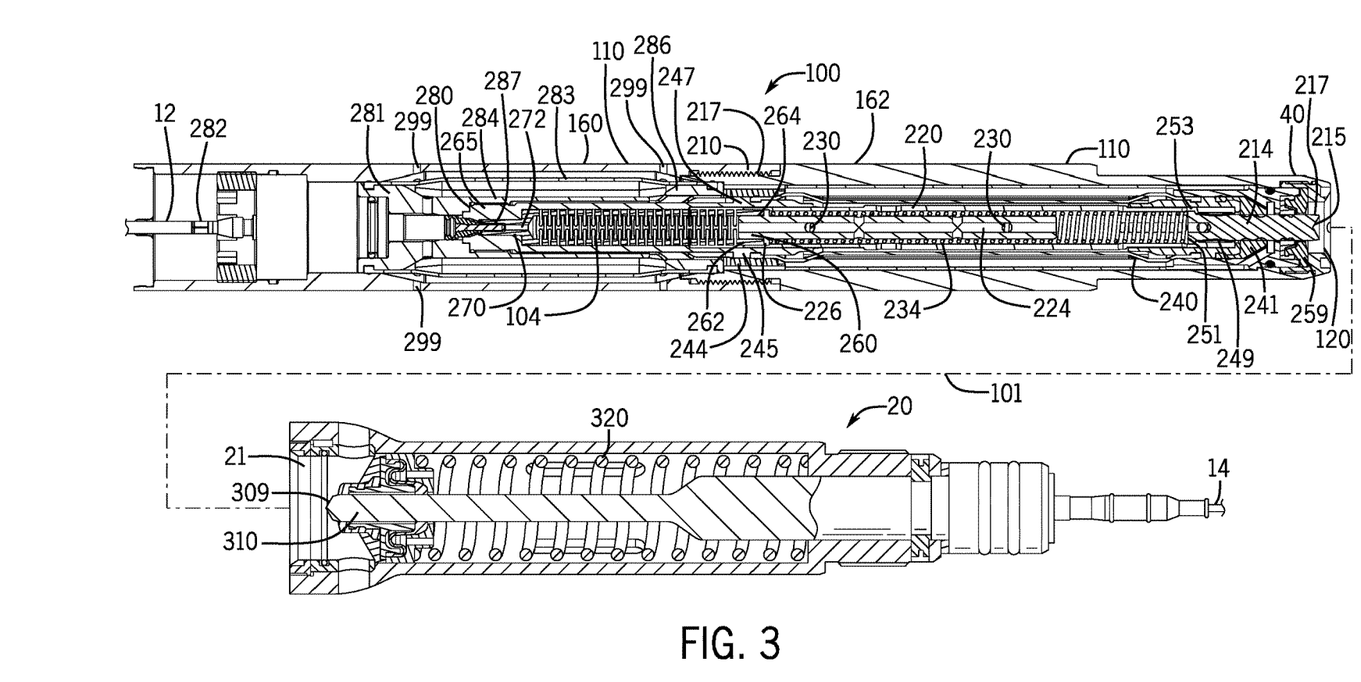
FIG. 3 is a cross-sectional view of the cable connector assemblies of FIG. 1A according to an example implementation.

As depicted in FIG. 2, in accordance with example implementations, the helical spring 234 extends from the shoulder 226 of the tube 245 to a stop that is formed by an end 251 of a shuttle pin 214. As depicted in FIG. 2, the shuttle pin 214 longitudinally extends along the longitudinal axis 101; and the end 251 of the shuttle pin 214 extends inside and contacts an electrically conductive louvered contact 249 (an electrical contact for the connector assembly 100) of the tube 220. Referring to FIG. 3, when the connector assemblies 100 and 20 mate, a distal end 309 of a pin 310 (i.e., an electrical contact) of the connector assembly 20 is received into a recess 215 located at distal end 217 of the shuttle pin 214. The pin 310 of the connector assembly 20 is biased toward the shuttle pin 214 by a helical spring 320 of the connector assembly 20, and the shuttle pin 214 is biased toward the pin 310 by the helical spring 234 of the connector assembly 100.

In accordance with example implementations, the helical spring 234 of the connector assembly 100 is preset to deflect first (before the slotted metal spring 104) to allow the pin 310 to push the shuttle pin 214 inwardly so that a contact band (not shown) of the pin 310 enters and contacts the louvered contact 249. The internal components of the connector assembly 100 may then move, as the slotted spring 104 deflects to absorb the load on these components.

Referring to FIG. 2, among its other features, in accordance with example implementations, the connector assembly 100 may include a wiper assembly 259 for purposes of forming a sealed connection between the pin 308 and the interior of the connector assembly 100. The connector assembly 100 may also include an annular seal 241, which forms a seal with the shuttle pin 214. Moreover, the connector assembly 100 may include a diaphragm (formed from components 240, 244 and 286), which circumscribes the longitudinal axis 101 and provides a seal for purposes of equalizing the pressure between an interior space contained within the diaphragm and the surrounding environment of the connector assembly 100. In this manner, in accordance with example implementations, inside the diaphragm, the connector assembly 100 may be filled with a dielectric oil, and the outside of the diaphragm may be in communication with the environment outside of the housing 110 via radial ports 299 that are formed in the housing 110. Moreover, the connector assembly 100 may include a cable termination module 282 to form electrical and mechanical connections with the cable segment 12. In accordance with example implementations, the cable termination module 282 may form a self locking and latching crimp termination connection to the cable segment 12. A pin 284 of the cable termination module 282 extends along the longitudinal axis 101 into a passageway 272 of the female end 270 of the slotted metal spring 104 to form an electrical connection between the conductor of the cable segment 14 and the slotted metal spring 104.

As described herein, the slotted metal spring 104 is electrically conductive. In other words, an electrical signal, such as a current and/or voltage, may be communicated between the cable segments 12 and 14 via an electrical communication path that includes the slotted metal spring 104. In accordance with example implementations, the electrical communication path includes the pin 284, the slotted metal spring 104, the tube 220 and the louvered contact 249.

In accordance with example implementations, electrical contact surfaces of the electrical connector assembly 100 may be plated (gold plated, for example) for purposes of reducing associated contact resistances, preventing oxidation and generally enhancing contact connections. For example, in accordance with some implementations, the metal body 502 of the slotted metal spring 104 may be gold plated or at least gold plated in a termination end 287 of the passageway 272 that receives the pin 284. In accordance with further example implementations, other contact surfaces of the slotted metal spring or contacting surfaces of the connector assembly 100 may be plated.

In accordance with example implementations, the slotted metal spring 104 may be formed from an electrically conductive metal alloy that has a relatively high yield strength, or yield stress, which allows the spring 104 to deform elastically in response to applied stress and return to its original shape when the applied stress is removed. As an example, in accordance with some implementations, the slotted metal spring 104 may be formed from a beryllium copper (BeCu) or a BeCu alloy. However, in accordance with further example implementations, the slotted metal spring 104 may be formed from another alloy, such as a copper-nickel-silicon alloy. In accordance with yet further example implementations, the slotted metal spring 104 may be replaced by another type of spring, such as a coiled, or helical, spring. Thus, many variations are contemplated, which are within the scope of the appended claims.

Figure 4:
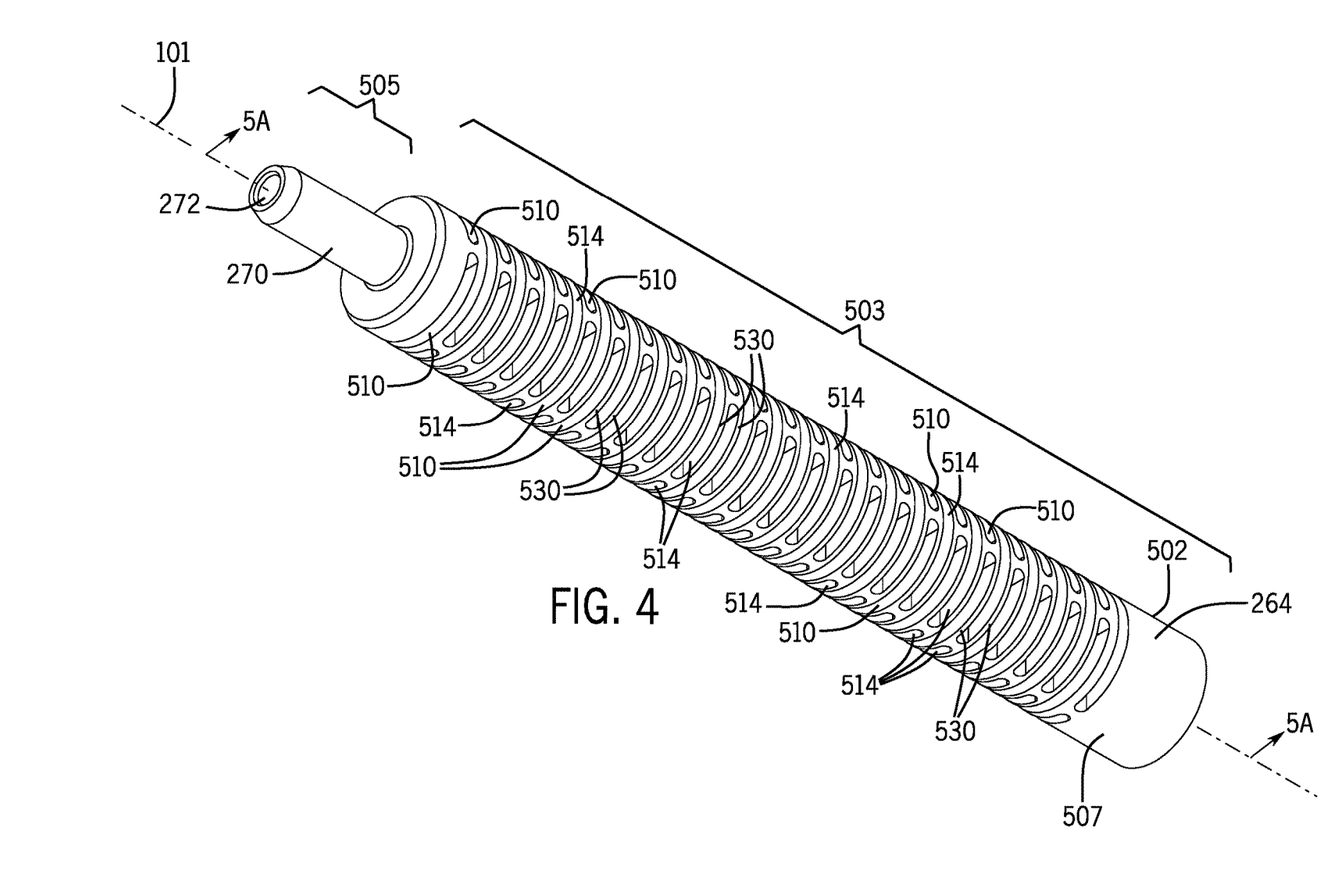
FIG. 4 is an isometric view of a slotted metal spring of the upper cable connector assembly of FIG. 1B according to an example implementation.
Figure 5A:
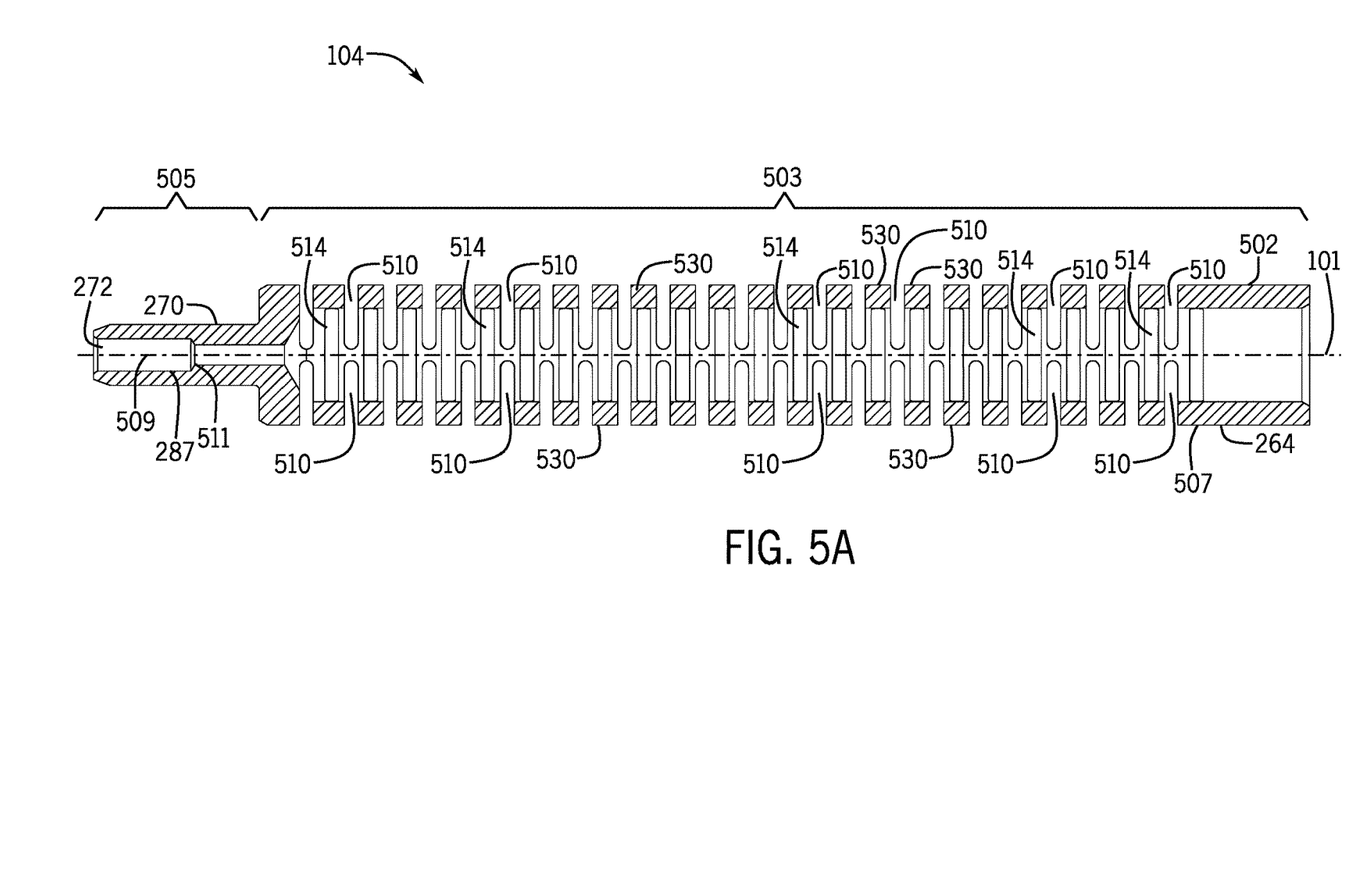
FIG. 5A is a cross-sectional view taken along line 5A-5A of FIG. 4 according to an example implementation.

Referring to FIG. 4, in accordance with example implementations, the slotted metal spring 104 includes a tubular body 502, which circumscribes the longitudinal connection axis 101. In general, the tubular body 502 includes a first longitudinal segment 503 that has a relatively larger radius about the longitudinal connection axis 101 and includes the pin end 264; and a longitudinal segment 505, which has a relatively smaller radius than the segment 503 and forms the female end 270. Moreover, as depicted in FIG. 5A, the longitudinal segment 503 contains radial slots 510 and 514 that are cut into an outer tubular wall 507 of the longitudinal segment 503 for purposes of imparting certain axial force versus deflection characteristics for the slotted metal spring 104.

It is noted, however, that the specific design of the end geometry of the slotted metal spring 104 depicted in FIG. 4 may vary, in accordance with further example implementations. In this manner, in accordance with further example implementations, the slotted metal spring may be symmetric about a central plane.

In accordance with example implementations, the slots 510 and 514 are arranged such that the slots 510 are axially interleaved with the slots 510 along the longitudinal connection axis 101. Moreover, in accordance with example implementations, the slots 510 are azimuthally offset with respect to the slots 514.

Figure 5B:
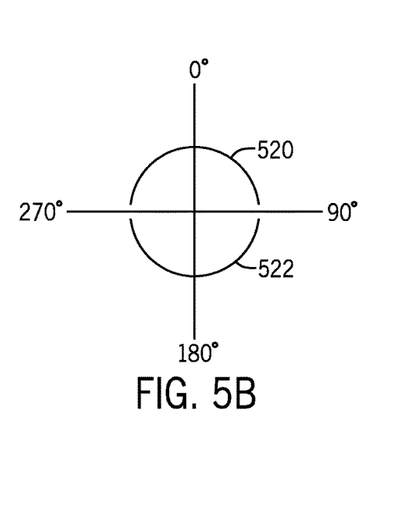
FIGS. 5B and 5C are illustrations of slot geometries of the slotted metal spring according to example implementations.
Figure 5C:
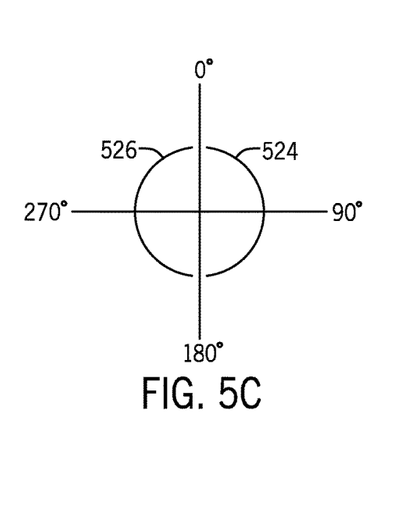

In this manner, referring to FIG. 5B, in accordance with example implementations, the slots 510 may be oriented such that a pair of slots 510 are disposed at the same axial location, and the slots 510 of the pair are diametrically opposed. For example, one slot 510 of the pair may extend along an azimuthal path 520 (see FIG. 5B). The azimuthal path 520 coincides with an azimuthal range extending from an azimuth greater than 270° to an azimuth less than 90°. The other slot 510 of the pair is diametrically opposed and may extend along an azimuthal path 522. The azimuthal path coincides with an azimuthal range extending from an azimuth greater than 90° to an azimuth less than 270°. In a similar manner, the slots 514 may be arranged in pairs at given axial positions. Moreover, the slots 514 for the example implementation depicted in FIG. 4 are offset by 90° relative to the slots 510. In this manner, for a given pair of slots 514, one slot 514 extends along an azimuthal path 524 (see FIG. 5C). The azimuthal path 524 coincides with an azimuthal range that extends from an azimuth greater than 0° to an azimuth less than 180°. The other slot 514 of the pair is diametrically opposed and extends along an azimuthal path 526. The azimuthal path 526 coincides with an azimuthal range that extends from an azimuth greater than 180° to an azimuth less than 360°.

Referring to FIG. 5A, in accordance with example implementations, each slot 510, 514 has a corresponding axial slot width and defines adjacent beams 530 for the slotted metal spring 104. As such, the slot widths establish deflection dimensions for beams 530 of the slotted metal spring 104. In accordance with some implementations, the slot width is uniform, and as a result, the slotted metal spring 104 exerts an axial force according to Hooke's law, i.e., the axially exerted force is proportional to the distance by which the spring 104 is compressed, or deflected. However, other slotted spring geometries and characteristics may be used, in accordance with further example implementations. For example, in accordance with further example implementations, the slot widths may be varied along the longitudinal axis 101 to create a constant force spring in which the spring exerts an axial force that is relatively constant and does not depend on the amount of deflection of the spring. Other force versus deflection profiles for the slotted spring may be used, in accordance with further example implementations.

As depicted in FIG. 5A, in accordance with some implementations, the pin passageway 272 may include an increased internal diameter section 509 for purposes of receiving the pin 284, and due to the reduction of diameter of the passageway 272 at the end of the passageway 509, a corresponding shoulder, or stop 511, may be formed to limit the axial travel of the pin 284 into the passageway 272.

Figure 6:
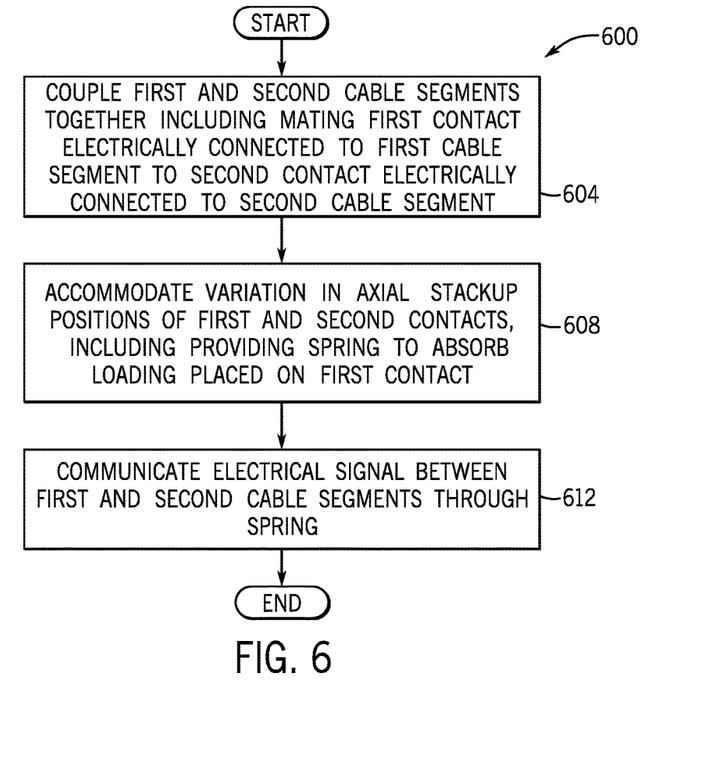
FIG. 6 is a flow diagram depicting a technique to couple cable segments together to accommodate a variation in the axial stackup positions of contacts of connector assemblies according to an example implementation.

Thus, referring to FIG. 6, in accordance with example implementations, a technique 600 includes coupling (block 600) first and second cable segments together, including mating a first contact that is electrically connected to the first cable segment to a second contact that is electrically connected to the second cable segment, pursuant to block 604. The technique 600 includes, pursuant to block 608, accommodating variation in an axial stackup positions of the first and second contacts, including absorbing a loading placed on the first and second contacts. Moreover, the technique 600 includes communicating (block 612) an electrical signal between the first and second cable segments through the spring.

The electrical connector assembly that is described herein may provide one or more of the following advantages. The connector assembly may provide a sufficient mechanical compliance to compensate for any stackup tolerances of the components of the connector assembly. The connector assembly may provide a relatively low resistance path for electrical signals to pass through the connector assembly. The connector assembly may provide a sufficient preload such that other components within the connector function as intended to prevent fluid ingress into the connector assembly. Moreover, the connector assembly may be housed within a relatively limited space constraint and provide a way to temporarily fix mating electrically conductive components.

While the present disclosure has been described with respect to a limited number of embodiments, those skilled in the art, having the benefit of this disclosure, will appreciate numerous modifications and variations therefrom. It is intended that the appended claims cover all such modifications and variations.

What is claimed is:

1. An apparatus comprising:
   a first contact to be electrically connected to a first cable segment and physically engage a second contact electrically connected to a second cable segment; and
   a first spring disposed along an longitudinal axis of the apparatus between the first contact and the first cable segment to absorb a loading placed on the first contact;
   a second spring disposed along the longitudinal axis between the first contact and the first cable segment to provide a biasing force along the longitudinal axis to bias the first contact to physically contact the second contact; and
   an electrically conductive member to extend along the longitudinal axis, wherein the electrically conductive member comprises a segment to extend axially along the second spring and radially bypass the second spring;
   wherein the first contact, the second contact, the first spring and the electrically conductive member form at least part of an electrical communication path between the first and second cable segments.

2. The apparatus of claim 1, wherein the first spring comprises a slotted spring or a helical spring.

3. The apparatus of claim 1, wherein the first spring comprises:
   a solid body comprising a material to extend along the longitudinal axis; and
   at least one slot in the solid body to allow the body to axially deflect.

4. The apparatus of claim 3, wherein the at least one slot comprises a plurality of machined slots in which portions of the material have been removed.

5. The apparatus of claim 1, wherein:
   the first spring comprises a cylindrical body to circumscribe and extend along the longitudinal axis;
   the cylindrical body comprises a first plurality of radial slots and a second plurality of radial slots axially interleaved with the first plurality of radial slots;
   the first plurality of radial slots are associated with a first azimuthal range about the longitudinal axis, the second plurality of slots are associated with a second azimuthal range about the longitudinal axis; and
   the first azimuthal range is different from the second azimuthal range.

6. The apparatus of claim 5, wherein:
   the first plurality of radial slots comprises pairs of slots;
   each pair of the first plurality of radial slots is associated with a position of a first plurality of positions along the axis;
   the second plurality of radial slots comprise pairs of slots;
   each pair of the second plurality of radial slots is associated with a position of a second plurality of positions along the longitudinal axis; and
   the first plurality of positions are interleaved with the second plurality of positions.

7. The apparatus of claim 1, wherein the second spring is preset to deflect first before the first spring.

8. The apparatus of claim 1, wherein:
the first spring comprises a slotted spring; and
the second spring comprises a helical spring.

9. The apparatus of claim 1, wherein the electrically conductive member comprises a tube that circumscribes the second spring.

10. The apparatus of claim 1, further comprising:
a tube to be circumscribed by the second spring, wherein the tube comprises a radial shoulder, and the radial shoulder contacts an end of the first spring and an end of the second spring.

11. The apparatus of claim 1, wherein the first spring comprises a body to extend along the longitudinal axis, and the body comprises radial slots to form beams to deflect along the longitudinal axis.

12. The apparatus of claim 11, further comprising a cable termination module connected to the first cable segment, wherein the body comprises a passageway to receive a pin associated with the cable termination module.

13. The apparatus of claim 1, wherein the first spring comprises beryllium copper or a copper-nickel-silicon alloy.

14. A system comprising:
a first cable segment;
a second cable segment;
a wellhead valve block;
a tubing hanger; and
a first connector assembly associated with the wellhead valve block and the first cable segment, the first connector assembly comprising a first contact;
a second connector assembly associated with the tubing hanger and the second cable segment, the second connector assembly comprising a second contact; and
wherein:
the first and second connector assemblies are adapted to mate to cause the first and second contacts to physically contact each other;
the first connector assembly comprises:
a first spring disposed along an longitudinal axis of the apparatus between the first contact and the first cable segment to absorb a loading placed on the first contact;
a second spring disposed along the longitudinal axis between the first contact and the first cable segment to provide a biasing force along the longitudinal axis to bias the first contact to physically contact the second contact; and
an electrically conductive member to extend along the longitudinal axis, wherein the electrically conductive member comprises a segment to extend axially along the second spring and radially bypass the second spring; and
the first contact, the second contact, the first spring and the electrically conductive member form at least part of an electrical communication path between the first and second cable segments.

15. The system of claim 13, wherein the first spring comprises a slotted spring.

16. The system of claim 15, wherein the slotted spring comprises slots to form a proportional axial force versus deflection characteristic for the slotted spring or a relatively constant axial force versus deflection characteristic for the slotted spring.

17. The system of claim 14, wherein:
the first spring comprises a cylindrical body to circumscribe and extend along the longitudinal axis;
the cylindrical body comprises a first plurality of radial slots and a second plurality of radial slots axially interleaved with the first plurality of radial slots;
the first plurality of radial slots are associated with a first azimuthal range about the longitudinal axis, the second plurality of slots are associated with a second azimuthal range about the longitudinal axis; and
the first azimuthal range is different from the second azimuthal range.

18. The system of claim 17, wherein:
the first plurality of radial slots comprises pairs of slots;
each pair of the first plurality of radial slots is associated with a position of a first plurality of positions along the longitudinal axis;
the second plurality of radial slots comprise pairs of slots;
each pair of the second plurality of radial slots is associated with a position of a second plurality of positions along the longitudinal axis; and
the first plurality of positions are interleaved with the second plurality of positions.

19. The system of claim 14, wherein the first spring comprises beryllium copper or a copper-nickel-silicon alloy.

20. A method comprising:
coupling first and second cable segments together including mating a first contact electrically connected to a first cable segment to a second contact electrically connected to a second cable segment such that the first contact physically contacts the second contact;
accommodating variation in axial stackup positions of the first and second contacts, comprising using a first spring disposed between the first contact and the first cable segment to absorb a loading placed on the first and second contacts;
exerting an axial biasing force using a second spring disposed between the first contact and the first cable segment to force the first and second contacts into physical contact with each other;
presetting the second spring to deflect first before the first spring deflects; and
communicating an electrical signal between the first and second cable segments through the first contact, the second contact, and the first spring.

21. The method of claim 20, further comprising coupling the cable segments to form an electrical connection for a cable that extends at least partially through a tubing hanger and a wellhead.

22. The method of claim 21, wherein coupling the cable segments together comprises coupling the cable segments using a pressure contained wet mate connector assembly.

* * * * *